United States Patent
Sebire et al.

(10) Patent No.: US 11,722,998 B2
(45) Date of Patent: Aug. 8, 2023

(54) METHODS AND DEVICES FOR TRANSMISSION BY SELECTING BETWEEN UPLINK RESOURCES

(71) Applicant: Nokia Technologies Oy, Espoo (FI)

(72) Inventors: Benoist Sebire, Tokyo (JP); Chunli Wu, Beijing (CN); Samuli Turtinen, Ii (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/840,057

(22) Filed: Jun. 14, 2022

(65) Prior Publication Data

US 2022/0310959 A1   Sep. 29, 2022

Related U.S. Application Data

(63) Continuation of application No. 16/758,788, filed as application No. PCT/CN2017/109575 on Nov. 6, 2017, now Pat. No. 11,395,262.

(51) Int. Cl.
*H04W 4/00* (2018.01)
*H04W 72/02* (2009.01)
(Continued)

(52) U.S. Cl.
CPC ....... *H04W 72/02* (2013.01); *H04W 72/0446* (2013.01); *H04W 72/1268* (2013.01);
(Continued)

(58) Field of Classification Search
CPC . H04W 72/02; H04W 72/0446; H04W 72/10; H04W 72/1268; H04W 72/14;
(Continued)

(56) References Cited

U.S. PATENT DOCUMENTS

2010/0281486 A1   11/2010   Lu et al.
2014/0133410 A1   5/2014   Nguyen et al.
(Continued)

FOREIGN PATENT DOCUMENTS

CN   103069882 A   4/2013
CN   106470474 A   3/2017
(Continued)

OTHER PUBLICATIONS

Office action received for corresponding Chinese Patent Application No. 201780096511.X, dated Sep. 28, 2022, 9 pages of office action and no page of translation available.
(Continued)

*Primary Examiner* — Chuong T Ho
(74) *Attorney, Agent, or Firm* — Alston & Bird LLP

(57) ABSTRACT

Embodiments of the present disclosure relate to methods and devices for transmission by selecting between uplink resources. According to a method implemented by a terminal device in a communication system, a configuration of a first resource is received from a network device, the first resource being a grant-free resource. An uplink grant is received from the network device, indicating a second resource for use in a transmission time interval. The terminal device determines, based on the configuration of the first resource, whether the first resource is available in the transmission time interval. In response to determining that the first resource is available and possibly in response to a predefined condition associated with a logical channel for the terminal device is met, the terminal device transmits uplink data to the network device using the first resource.

20 Claims, 4 Drawing Sheets

(51) Int. Cl.
| | |
|---|---|
| *H04W 72/0446* | (2023.01) |
| *H04W 72/1268* | (2023.01) |
| *H04W 72/23* | (2023.01) |
| *H04W 72/56* | (2023.01) |
| *H10K 50/11* | (2023.01) |
| *H10K 85/60* | (2023.01) |
| *H10K 101/40* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 50/818* | (2023.01) |
| *H10K 50/828* | (2023.01) |
| *H10K 101/10* | (2023.01) |
| *H10K 102/00* | (2023.01) |

(52) U.S. Cl.
CPC .......... *H04W 72/23* (2023.01); *H04W 72/56* (2023.01); *H10K 50/11* (2023.02); *H10K 85/626* (2023.02); *H10K 85/633* (2023.02); *H10K 85/636* (2023.02); *H10K 85/654* (2023.02); *H10K 85/6572* (2023.02); *H10K 85/6576* (2023.02); *H10K 50/15* (2023.02); *H10K 50/16* (2023.02); *H10K 50/17* (2023.02); *H10K 50/171* (2023.02); *H10K 50/18* (2023.02); *H10K 50/818* (2023.02); *H10K 50/828* (2023.02); *H10K 85/622* (2023.02); *H10K 85/6574* (2023.02); *H10K 2101/10* (2023.02); *H10K 2101/40* (2023.02); *H10K 2102/3026* (2023.02); *H10K 2102/351* (2023.02)

(58) Field of Classification Search
CPC ............ H04W 48/12; H04W 72/1289; H04W 72/1242; H01L 51/0058; H01L 51/006; H01L 51/0061; H01L 51/0067; H01L 51/0072; H01L 51/0074; H01L 51/5004; H01L 51/0054; H01L 51/0073; H01L 51/5016; H01L 51/5056; H01L 51/5072; H01L 51/5088; H01L 51/5092; H01L 51/5096; H01L 51/5218; H01L 51/5234; H01L 2251/5315; H01L 2251/558
USPC ......................................... 370/329, 330, 328
See application file for complete search history.

(56) References Cited

U.S. PATENT DOCUMENTS

| | | |
|---|---|---|
| 2018/0035459 A1 | 2/2018 | Islam et al. |
| 2018/0139030 A1 | 5/2018 | Kim et al. |
| 2018/0324635 A1* | 11/2018 | Babaei .............. H04W 74/0891 |
| 2019/0357178 A1 | 11/2019 | Bae et al. |
| 2020/0037345 A1* | 1/2020 | Ryoo ................ H04W 72/1284 |
| 2021/0212108 A1* | 7/2021 | Lou ........................ H04W 80/02 |

FOREIGN PATENT DOCUMENTS

| | | |
|---|---|---|
| CN | 107210871 A | 9/2017 |
| WO | 2015/174748 A1 | 11/2015 |

OTHER PUBLICATIONS

"3rd Generation Partnership Project;Technical Specification Group Radio Access Network; Evolved Universal Terrestrial Radio Access (E-UTRA) and Evolved Universal Terrestrial Radio Access Network (E-UTRAN); Overall description; Stage 2 (Release 14)", 3GPP TS 36.300, V14.4.0, Sep. 2017, pp. 1-329.

"3rd Generation Partnership Project;Technical Specification Group Radio Access Network; Evolved Universal Terrestrial Radio Access (E-UTRA);Medium Access Control (MAC) protocol specification(Release 14)", 3GPP TS 36.321, V14.4.0, Sep. 2017, pp. 1-108.

"3rd Generation Partnership Project; Technical Specification Group Radio Access Network; NR; NR and NG-RAN Overall Description; Stage 2 (Release 15)", 3GPP TS 38.300, V1.0.0, Sep. 2017, pp. 1-59.

International Search Report and Written Opinion received for corresponding Patent Cooperation Treaty Application No. PCT/CN2017/109575, dated Jun. 27, 2018, 9 pages.

"Grant-free to grant-based switching for URLLC", 3GPP TSG-RAN WG1 #87, R1-1612253, Agenda : 7.1.4.4, Nokia, Nov. 14-18, 2016, 3 pages.

Extended European Search Report received for corresponding European Patent Application No. 17931058.6, dated Jun. 7, 2021, 11 pages.

"Collision between grant-based and grant-free resources on the same UL carrier", 3GPP TSG-RAN WG2 Meeting #99bis, Vivo, Agenda Item: 10.3.1.8, R2-1710960, Oct. 9-13, 2017, 3 pages.

"Grant-free resource configuration", 3GPP TSG-RAN WG2 Meeting #98, Huawei, Agenda Item: 10.3.1, R2-1705118, May 15-19, 2017, 4 pages.

Non-Final Office action received for corresponding U.S. Appl. No. 16/758,788, dated Nov. 26, 2021, 17 pages.

Notice of Allowance received for corresponding U.S. Appl. No. 16/758,788, dated Mar. 31, 2022, 10 pages.

\* cited by examiner

METHODS AND DEVICES FOR TRANSMISSION BY SELECTING BETWEEN UPLINK RESOURCES

CROSS REFERENCE TO RELATED APPLICATION

This application is a continuation of U.S. application Ser. No. 16/758,788, filed Apr. 23, 2020, which is the national phase entry claims priority to PCT Application No. PCT/CN2017/109575, filed Nov. 6, 2017, which is incorporated herein by reference in its entirety.

TECHNICAL FIELD

Embodiments of the present disclosure generally relate to the field of telecommunication, and in particular, to methods and devices for transmission by selecting between uplink resources.

BACKGROUND

Wireless communications systems are widely deployed to provide various types of communication content such as voice, video, packet data, messaging, broadcast, and so on. These systems may be capable of supporting communication with users using the available system resources (e.g., time, frequency, and power). A wireless multiple-access communications system may include a number of network devices, each simultaneously supporting communication for multiple terminal devices, which may each be referred to as user equipment (UE). A new generation of radio communication techniques, which is referred to as new radio (NR) technique, is now developing to deliver low latency connectivity and massive networking.

Generally, resources are required to perform uplink and downlink transmissions between the network device and terminal device. In uplink communications, the resources used in uplink transmission are generally scheduled by the serving network device. The resources to be scheduled may include grant-based resources and grant-free resources. Specifically, to schedule a grant-based resource, the network device dynamically provide an uplink grant to a terminal device in each transmission time interval (TTI) on a physical downlink control channel (PDCCH). The terminal device monitors the uplink grant on the PDCCH to receive possible allocations for uplink transmission. On the other hand, to schedule a grant-free resource, the network device can provide a related configuration of the grant-free resource to the terminal device via radio resource control (RRC) signaling and a PDCCH. The RRC signaling may indicate the periodicity of a resource and the PDCCH indicates whether the resource is a grant-free resource. In this case, the terminal device may reuse the grant-free resource in the following TTIs according to the periodicity.

There may be some cases where the terminal device receives an uplink grant indicating a grant-based resource overlapped with the grant-free resource in the same TTI. The terminal device may decide which resource is prioritized to be used for uplink transmission.

SUMMARY

In general, example embodiments of the present disclosure provide methods and devices for transmission by selecting between uplink resources.

In a first aspect, there is provided a method implemented by a terminal device in a communication system. The method includes receiving, from a network device, a configuration of a first resource, the first resource being a grant-free resource, and receiving, from the network device, an uplink grant indicating a second resource for use in a transmission time interval. The method also includes determining, based on the configuration of the first resource, whether the first resource is available in the transmission time interval. The method further includes, in response to determining that the first resource is available in the transmission time interval, transmitting uplink data to the network device using the first resource.

In a second aspect, there is provided a method implemented by a terminal device in a communication system. The method includes receiving, from a network device, a configuration of a first resource, the first resource being a grant-free resource, and receiving, from the network device, an uplink grant indicating a second resource for use in a transmission time interval. The method also includes determining, based on the configuration of the first resource, whether the first resource is available in the transmission time interval and determining whether a predefined condition associated with a logical channel for the terminal device is met. The method further includes, in response to determining that the first resource is available in the transmission time interval and the condition is met, transmitting uplink data to the network device on the logical channel using the first resource.

In a third aspect, there is provided a terminal device. The terminal device includes a processor; and a memory coupled to the processing unit and storing instructions thereon, the instructions, when executed by the processing unit, causing the terminal device to perform acts. The acts include receiving, from a network device, a configuration of a first resource, the first resource being a grant-free resource, and receiving, from the network device, an uplink grant indicating a second resource for use in a transmission time interval. The acts also include determining, based on the configuration of the first resource, whether the first resource is available in the transmission time interval. The acts further include, in response to determining that the first resource is available in the transmission time interval, transmitting uplink data to the network device using the first resource.

In a fourth aspect, there is provided a terminal device. The terminal device includes a processor; and a memory coupled to the processing unit and storing instructions thereon, the instructions, when executed by the processing unit, causing the terminal device to perform acts. The acts include receiving, from a network device, a configuration of a first resource, the first resource being a grant-free resource, and receiving, from the network device, an uplink grant indicating a second resource for use in a transmission time interval. The acts also include determining, based on the configuration of the first resource, whether the first resource is available in the transmission time interval and determining whether a predefined condition associated with a logical channel for the terminal device is met. The acts further include, in response to determining that the first resource is available in the transmission time interval and the condition is met, transmitting uplink data to the network device on the logical channel using the first resource.

In a fifth aspect, there is provided a computer readable medium having instructions stored thereon. The instructions, when executed on at least one processor, cause the at least one processor to carry out the method according to the first or second aspect.

In a sixth aspect, there is provided a computer program product that is tangibly stored on a computer readable storage medium. The computer program product includes instructions which, when executed on at least one processor, cause the at least one processor to carry out the method according to the first or second aspect.

Other features of the present disclosure will become easily comprehensible through the following description.

BRIEF DESCRIPTION OF THE DRAWINGS

Through the more detailed description of some embodiments of the present disclosure in the accompanying drawings, the above and other objects, features and advantages of the present disclosure will become more apparent, wherein.

Throughout the drawings, the same or similar reference numerals represent the same or similar element.

DETAILED DESCRIPTION

Figure 1:
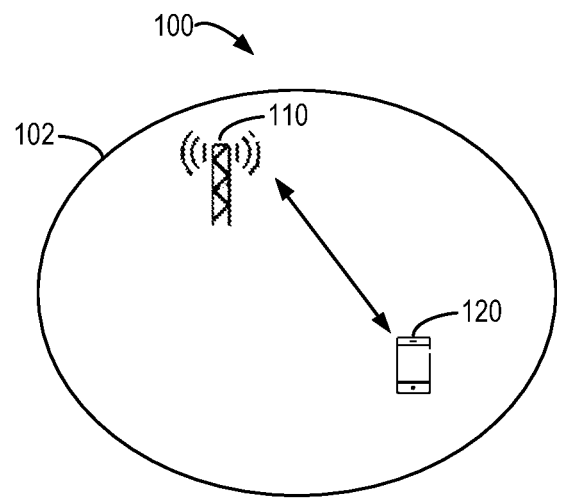
FIG. 1 is a block diagram of a communication environment in which embodiments of the present disclosure can be implemented.

Principle of the present disclosure will now be described with reference to some example embodiments. It is to be understood that these embodiments are described only for the purpose of illustration and help those skilled in the art to understand and implement the present disclosure, without suggesting any limitations as to the scope of the disclosure. The disclosure described herein can be implemented in various manners other than the ones described below.

In the following description and claims, unless defined otherwise, all technical and scientific terms used herein have the same meaning as commonly understood by one of ordinary skills in the art to which this disclosure belongs.

As used herein, the term "network device" or "base station" (BS) refers to a device which is capable of providing or hosting a cell or coverage where terminal devices can communicate. Examples of a network device include, but not limited to, a Node B (NodeB or NB), an Evolved NodeB (eNodeB or eNB), a Remote Radio Unit (RRU), a radio head (RH), a remote radio head (RRH), a low power node such as a femto node, a pico node, and the like. For the purpose of discussion, in the following, some embodiments will be described with reference to eNB as examples of the network device.

As used herein, the term "terminal device" refers to any device having wireless or wired communication capabilities. Examples of the terminal device include, but not limited to, user equipment (UE), personal computers, desktops, mobile phones, cellular phones, smart phones, personal digital assistants (PDAs), portable computers, image capture devices such as digital cameras, gaming devices, music storage and playback appliances, or Internet appliances enabling wireless or wired Internet access and browsing and the like. For the purpose of discussion, in the following, some embodiments will be described with reference to UEs as examples of terminal devices and the terms "terminal device" and "user equipment" (UE) may be used interchangeably in the context of the present disclosure.

As used herein, the singular forms "a", "an" and "the" are intended to include the plural forms as well, unless the context clearly indicates otherwise. The term "includes" and its variants are to be read as open terms that mean "includes, but is not limited to." The term "based on" is to be read as "based at least in part on." The term "one embodiment" and "an embodiment" are to be read as "at least one embodiment." The term "another embodiment" is to be read as "at least one other embodiment." The terms "first," "second," and the like may refer to different or same objects. Other definitions, explicit and implicit, may be included below.

In some examples, values, procedures, or apparatus are referred to as "best," "lowest," "highest," "minimum," "maximum," or the like. It will be appreciated that such descriptions are intended to indicate that a selection among many used functional alternatives can be made, and such selections need not be better, smaller, higher, or otherwise preferable to other selections.

FIG. 1 shows an example communication network 100 in which embodiments of the present disclosure can be implemented. The network 100 includes a network device 110 and a terminal device 120 served by the network device 110. The serving area of the network device 110 is called as a cell 102. It is to be understood that the number of network devices and terminal devices is only for the purpose of illustration without suggesting any limitations. The network 100 may include any suitable number of network devices and terminal devices adapted for implementing embodiments of the present disclosure. Although not shown, it would be appreciated that one or more terminal devices may be located in the cell 102 and served by the network device 110.

In the communication network 100, the network device 110 can communicate data and control information to the terminal device 120 and the terminal device 120 can also communication data and control information to the network device 110. A link from the network device 110 to the terminal device 120 is referred to as a downlink (DL), while a link from the terminal device 120 to the network device 110 is referred to as an uplink (UL).

The communications in the network 100 may conform to any suitable standards including, but not limited to, Global System for Mobile Communications (GSM), Extended Coverage Global System for Mobile Internet of Things (EC-GSM-IoT), Long Term Evolution (LTE), LTE-Evolution, LTE-Advanced (LTE-A), Wideband Code Division Multiple Access (WCDMA), Code Division Multiple Access (CDMA), GSM EDGE Radio Access Network (GERAN), and the like. Furthermore, the communications may be performed according to any generation communication protocols either currently known or to be developed in the future. Examples of the communication protocols include, but not limited to, the first generation (1G), the second generation (2G), 2.5G, 2.75G, the third generation (3G), the fourth generation (4G), 4.5G, the fifth generation (5G) communication protocols.

As mentioned above, resources are required to perform uplink and downlink transmissions. Especially for the uplink transmissions, a terminal device may use the uplink resource scheduled by a network device to transmit uplink data. In some traditional systems such as LTE system, the network device may allocate a dynamic uplink grant to indicate a grant-based resource that can be used in a transmission time interval (TTI). The network device may also provide a configuration of a grant-free resource (for example, via a semi-persistent scheduling (SPS)) and the grant-free resource can be reused for the following TTIs without being granted. In some cases, the terminal device may detect that both the grant-based and grant-free resources are available in the same TTI. When the two types of uplink resources are both available within a TTI, the terminal device may have to choose to prioritize one of the grant-based and grant-free resources for use in the uplink transmission of the TTI.

In traditional communication systems such as LTE systems, it has been specified by some communication specifications that the terminal device should never ignore a dynamic uplink grant. That is to say, the dynamic uplink grant will always be prioritized. This is because the network device may not be able to predict when the grant-free resource is used and thus a dynamic uplink grant may be issued at the same time, for example, for the case when uplink data of Ultra-Reliable Low Latency Communications (URLLC) is arrived while a lower priority service (such as uplink data of enhanced Mobile Broadband (eMBB) communications) is in progress. If the terminal device can only transmit uplink data using a resource of one grant, for example, when a single carrier is employed, the terminal device may select the grant-based resource in the dynamic uplink grant for transmitting the uplink data.

The rule of always prioritizing the dynamic uplink grant works wells in most of the cases in the traditional communication systems. With the development of communication techniques, a new generation of radio communication technique is now developing, which is referred to as a new radio (NR) technique. In NR, Type 1 and Type 2 allocations of grant-free resource are introduced as a way for the UE to transmit in uplink. In Type 1 allocation, an uplink resource is configured to the terminal device via RRC signaling without L1 signaling from the network device. Type 2 allocation is similar to that in the traditional systems such as LTE systems, where RRC signaling is only used to configure the periodicity and the uplink resource is allocated by the L1 signaling. Generally speaking, Type 1 allocation is motivated by URLLC services so as to reduce latency by skipping the dynamic uplink grant steps and to improve reliability, for example, by configuring more conservative grants. In some examples, the grant-free resource can be shared by multiple terminal devices and collisions may therefore occur.

In addition to the different types of grant-free resource allocations, the NR technique has further introduced a feature of Logical Channel Prioritisation (LCP) in the traditional communication techniques. In LTE, how the UE multiplexes uplink data onto a transport block is controlled with the LCP. The LCP specifies a PBR (Prioritized Bit Rate) per bearer (i.e. per logical channel), to ensure logical channels of greater priorities are scheduled first while avoiding the starvation of lower priority ones. The PBR is used by the Token Bucket mechanism in the LCP. In NR, LCP is enhanced further by the introduction of a logical channel mapping constraint. The constraint is used to limit how a logical channel uses an uplink grant depending on the numerology, the TTI associated to that grant, and possibly on whether a logical channel is allowed to use the grant-free resource (to avoid, for example, a non-URLLC bearer to use the grant-free resource and create too much collision to other terminal devices) or the grant-based resource.

There may be some problems raised if the terminal device always prioritizes the dynamic uplink grant as specified traditionally in the LTE systems. For example, the dynamically configured grant-based resources may not be used to guarantee the requirement on quality of service (QoS) for some uplink data of high priority services, such as URLLC. In addition, if the constraint in the LCP indicates that uplink data of a certain logical channel is not allowed to be transmitted on the grant-based resource, the transmission of the uplink data may be failed or may introduce a severe reduction in performance by using the grant-based resource.

In accordance with embodiments of the present disclosure, there is provided a solution for transmission by selecting between uplink resources. According to some embodiments, when a first resource configured as a grant-free resource and a second resource indicated by an uplink grant are both available in a same transmission time interval (TTI), a terminal device transmits uplink data using the first resource instead of the second resource indicated by the uplink grant. Alternatively, the terminal device additionally determines whether a predefined condition is met and transmits uplink data using the first resource if the condition is met. In this case, it is possible to avoid system performance reduction if grant-based resources always prioritize over grant-free resources.

Figure 2A:
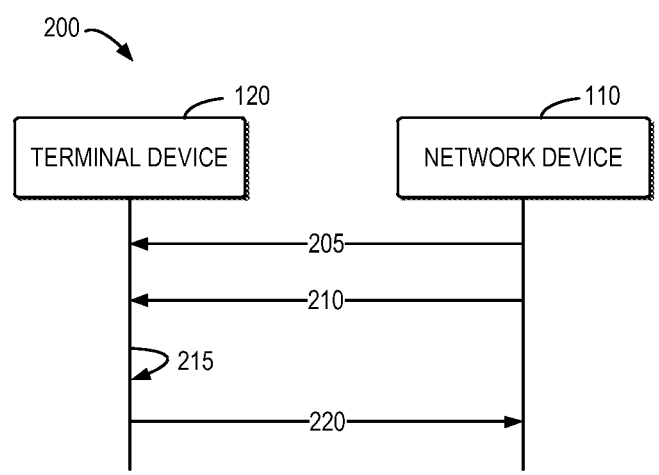
FIG. 2A is a flowchart illustrating a process of transmission by selecting between uplink resources according to some embodiments of the present disclosure.
Figure 2B:
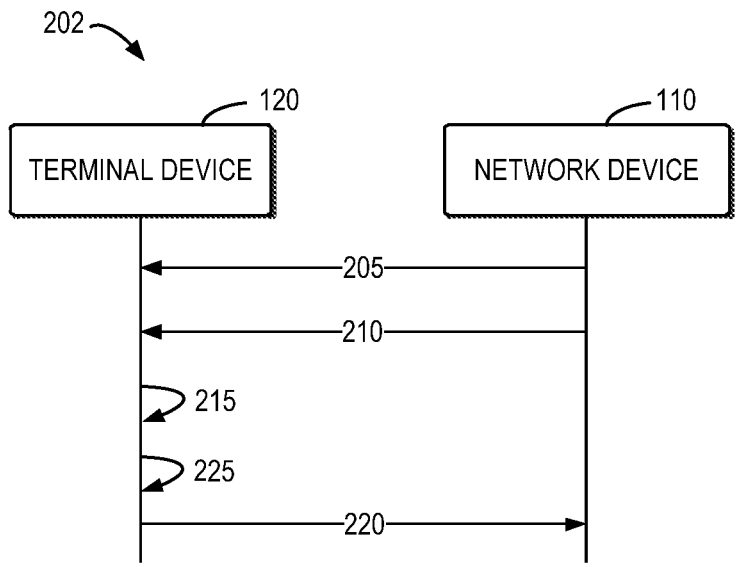
FIG. 2B is a flowchart illustrating a process of transmission by selecting between uplink resources according to some other embodiments of the present disclosure.

Principle and embodiments of the present disclosure will be described in detail below with reference to FIGS. 2A and 2B, which shows different processes 200 and 202 for transmission by selecting between uplink resources, respectively, according to an embodiment of the present disclosure. For the purpose of discussion, the processes 200 and 202 will be described with reference to FIG. 1. Both the processes 200 and 202 may involve the network device 110 and the terminal device 120 in FIG. 1. The process 200 in FIG. 2A is first described.

At 205, the terminal device 120 receives a configuration of a resource from the network device 110. The resource is referred to as a first resource hereinafter for convenience. The network device 110 provides the configuration to schedule an uplink resource for the terminal device 120 to use in the following multiple TTIs. The configuration of the first resource may include a periodicity of the first resource, one or more time and/or frequency slots for the first resource, such as physical resource blocks (PRBs), and/or other configuration parameters, such as a modulation and coding scheme (MCS) and/or numerology used for the first resource. With the configuration, the terminal device 120 can determine when the first resource can be used for uplink transmissions according to the periodicity without further grant signaling needed from the network device. Thus, the first resource may also be referred to as a grant-free resource because it is needed to be only granted at the very beginning, not in every TTI it may be available.

In some embodiments, the first resource may be configured via higher layer signaling. For example, the periodicity of the resource may be indicated via radio resource control (RRC) signaling, and data on a physical downlink control channel (PDCCH) may indicate whether the first resource is a grant-free resource (for example, whether a corresponding resource can be implicitly reused in the following transmission time intervals (TTIs) according to the periodicity), the time and/or frequency slots of the first resource, and other information. In some other systems, for examples, NR-based systems, the first resource may be configured via the RRC signaling only (for Type 1 resource allocation, for example) without L1 signaling. For other types of resource allocations in the NR-based systems, such as Type 2 resource allocation, both the RRC signaling and L1 signaling are transmitted to the terminal device 120 to configure the first resource.

It would be appreciated that some examples of signaling configuration of the first resource are presented for purpose of illustration only, and other types of signaling may also be employed in other systems if required. It would also be appreciated that the configuration of the first resource may also be transmitted as an uplink grant although it may be issued ("granted") from the network device 110 once for a relatively long period of time. The configuration of the first resource may be changed by the network device after a period of time, depending on the actual requirements and system configurations.

At 210, the terminal device 120 receives an uplink grant transmitted from the network device 110. The uplink grant indicates an uplink resource for use in a TTI (which may be referred to as a second resource hereinafter for convenience). The network device 110 may transmit the uplink grant per TTI, for example, upon a request from the terminal device 120. This uplink grant may be referred to as a dynamic uplink grant, and the second resource indicated in the dynamic uplink grant may be referred to as a grant-based resource because it can only be used for transmission after being granted. Generally, the second resource can be used in that specific TTI.

In some embodiments, the dynamic uplink grant may be scheduled through a physical channel, such as a physical downlink control channel (PDCCH). The terminal device 120 may monitor the physical channel to receive the dynamic grant when its downlink reception is enabled. The resource indicated in the dynamic uplink grant may include one or more PRBs. The dynamic uplink grant may also indicate other uplink configurations such as the MCS to be employed by the terminal device 120.

At 215, the terminal device 120 determines, based on the configuration of the first resource, whether the first resource is available in the same TTI as the second resource). Since the periodicity of the first resource included in the configuration can indicate the frequency of the first resource in time, in some examples, the terminal device 120 may determine, based on the periodicity, whether the first resource is available in the TTI. When it is determined that both the first and second resources are available in the same TTI, the terminal device 120 detects that these resources are overlapped in time and will decide which resource is prioritized over the other one. It would be appreciated that although the first and second resources are overlapped in a TTI, they may occupy the same or different time and/or frequency slots in that TTI.

The decision is needed because in some cases, more than one logical channel for the terminal device 120 may have buffered uplink data to be transmitted. The terminal device 120 may transmit uplink data to the network device 110 over one or more carriers. In the case that a single carrier is configured for the terminal device 120 or the resources are allocated on the same carrier, it can only transmit uplink data on one logical channel through that carrier to the network device 110. As such, the terminal device 120 may determine which resource can be selected and the uplink data on which logical channel can be transmitted using that resource. If there are multiple carriers used when carrier aggregation (CA) is employed, the terminal device 120 may also determine whether the first resource or the second resource is prioritized for transmitting some logical channels when the resources are allocated on different carriers.

Although the scenarios of multiple logical channels with buffered uplink data to be transmitted are discussed, it would be appreciated that when only one logical channel has buffered uplink data to be transmitted, the terminal device 120 may also need to make a selection between the uplink resources.

As analyzed above, traditionally, a terminal device is not allowed to ignore the dynamic uplink grant and will always prioritize the grant-based resource indicated by the dynamic uplink grant, which may cause some undesirable results. In accordance with some embodiments of the present disclosure, in the process 200, the terminal device 120 simply selects the first resource (that is, the grant-free resource) instead of the second resource (that is the grant-based resource). Thus, at 220, the terminal device 120 transmits uplink data to the network device using the first resource.

The uplink data may be buffered on a certain logical channel for the terminal device 120. In the case of a single carrier, the terminal device 120 can transmit the uplink data using the first resource in the TTI. Then the second resource may be ignored. In the case of CA, if the first resource is allocated on a first carrier and the second resource is allocated on a second different carrier, and if there are two or more logical channels that have buffered uplink data to be transmitted, the terminal device 120 may transmit uplink data on a first logical channel using the first resource and further uplink data on a second logical channel using the second resource in that TTI.

In some embodiments, the terminal device 120 may determine the uplink data on which logical channel (or logical channels in the case of CA) is transmitted based on the priorities of the logical channels. A priority of a logical channel may be notified to the terminal device 120, for example, via the Logical Channel Prioritisation (LCP) configuration from the network device 110. In some examples, the priority of the logical channel may be corresponding to a priority of a service uplink data of which is carried on the logical channel. For example, a logical channel for carrying uplink data of URLLC may have a higher priority than other logical channels, such as those for carrying eMBB data, Machine Type Communications (MTC) data, massive MTC (mMTC) data, or some other types of user data.

In some embodiments, uplink data on a logical channel with a greater priority may be selected for transmission first in order to avoid possible large latency. In such case, the terminal device 120 can always transmit uplink data on a logical channel with a high priority (such as URLLC data, if any) using the first resource. In some embodiments where the terminal device 120 has a limited power and multiple carriers are used for support uplink transmission in different carriers using the first and second resources, respectively, the power may also be prioritized for the first, grant-free resource. Specifically, the terminal device 120 may transmit uplink data using the first resource with a first power level and transmit uplink data using the second resource with a second lower power level. The greater power level may further improve the transmission quality of the corresponding uplink data.

In some embodiments, if the terminal device 120 determines at 215 that the first resource is not available in the TTI, the terminal device 120 may of course transmit uplink data using the second resource indicated by the dynamic uplink grant.

In the above embodiments discussed with respect to the process 200, the terminal device 120 is configured to directly select the first, grant-free resource for uplink transmission in that TTI. In some other embodiments of the present disclosure, the terminal device 120 can alternatively take a condition associated with a logical channel into account when determining which resource is to be prioritized. Such embodiments will be discussed with reference to the process 202 in FIG. 2B. In the process 202, the terminal device 120 performs substantially the same acts at 205, 210, and 215 to receive a configuration of a first, grant-free resource and an uplink grant of a second, grant-based resource, and determine whether the first and second resources are available in the same TTI.

Additionally, in the process 202, the terminal device 120 determines at 225 whether a predefined condition associated with a logical channel for the terminal device is met. It would be appreciated that the terminal device may also perform the determination at 220 before or in parallel with the determination at 215. At 220, when the terminal device 120 determines that the first resource is available in the transmission time interval at 215 and the condition is met at 225, it transmits uplink data to the network device on the logical channel using the first resource.

In some embodiments, the predefined condition may be related to a priority of the logical channel and/or a constraint indicating whether uplink data on the logical channel is allowed to be transmitted using the first resource or the second resource. In some embodiments, the priority and/or the constraint may be included in the LCP configured by the network device 110. The considered logical channel may be a channel that has buffered uplink data to be transmitted. It would be appreciated that any other condition that is associated with the logical channel and have effects on the resource selection may also be taken into consideration.

Some embodiments will be provided in detail to describe the predefined condition and in what cases the condition can be met. In an embodiment, the terminal device 120 determines whether the condition is met or not based on the priority of the logical channel. The terminal device 120 may compare the priority of the logical channel with a threshold priority and determine the predefined condition is met if the priority of the logical channel is greater than the threshold priority. In this way, the terminal device 120 can transmit uplink data on the logical channel with a greater priority using the first resource. If the priority is lower than the threshold priority, the terminal device 120 determines that the condition is not met and can transmit the uplink data using the second resource. The threshold priority can be set to allow uplink data of logical channels with a sufficient high priority (such as URLLC data) to be transmitted using the first resource. Indeed, it should be appreciated that multiple logical channels may meet the condition to transmit the uplink data using the first resource. In such an event, a multiplexing function in the MAC layer is used to multiplex data from multiple logical channels on to the first resource.

In some embodiments, if more than one logical channel has buffered uplink data, the terminal device 120 may compare the priorities of these logical channels. If one of the logical channels has the greatest priority according to the comparison result, the terminal device 120 may determine that the condition is met for this logical channel and thus will transmit uplink data on this logical channel using the first resource.

In addition to the priority of the logical channel, as mentioned, the terminal device 120 may additionally consider the constraint. In some embodiments, if the terminal device 120 determines that the priority of the logical channel is greater than the threshold priority (or is the greatest priority among other logical channels) and the constraint indicates that the uplink data on this logical channel is allowed to be transmitted using the first resource, the terminal device 120 may determine that the condition is met. In some other embodiments, the constraint may be used independently. For example, when the constraint indicates that the uplink data on the logical channel is allowed to be transmitted using the first resource, the terminal device 120 determines that the condition is met.

In some embodiments, the terminal device 120 may determine that the condition is met when the constraint indicates that the uplink data is allowed to be transmitted using only the first resource (with or without considering the priority of the logical channel). If the constraint indicates that the uplink data is allowed to be transmitted using both the first and second resources or using the second resource only, the terminal device 120 may determine that the predefined condition is failed to be met and thus transmit the corresponding uplink data using the second resource instead of the first resource. For example, for a certain logical channel, if the second resource has the same characteristics as the first resource in terms of the priority and the constraint, the terminal device 120 may select the second resource. This may further improve the transmission quality because the second resource is specially allocated to the terminal device 120 and is usually not shared with other terminal devices.

In some embodiments, if in any case the terminal device 120 determines that the condition is not met, the terminal device 120 may instead transmit the uplink data on the logical channel using the second resource. For example, if the priority of the logical channel is relatively low or the constraint indicates that the uplink data on the logical channel is not only allowed to be transmitted using the first resource, the terminal device 120 may transmit that uplink data using the second resource that is dynamically scheduled in the current TTI.

The condition and the satisfaction of the condition have been discussed above with reference to some embodiments, which are applicable to both scenarios with a single carrier and multiple carriers. In the scenario with a single carrier, since both the first and second resources are allocated on the same carrier, if the terminal device 120 decides to use the first resource, the second resource may be ignored in the current TTI. This may also be subject to capability of the terminal device 120 of not transmitting on multiple resources within the same carrier. In the scenario with multiple carriers, if the first and second resources are allocated on different carriers, the terminal device 120 may transmit uplink data of two logical channels using both the resources. In this case, the first resource is prioritized over the second resource in that if the predefined condition associated with a certain logical channel is met, uplink data on this logical channel can be prioritized to be transmitted using the first resource.

Similar to the embodiments as described in the process 200, in the scenario with multiple carriers, the terminal device 120 may allocate a relatively great power level for the uplink transmission using the first resource and a relatively low power level for the uplink transmission using the second resource. The quality of the uplink transmission using the first resource can be improved with the greater power level.

Figure 3:
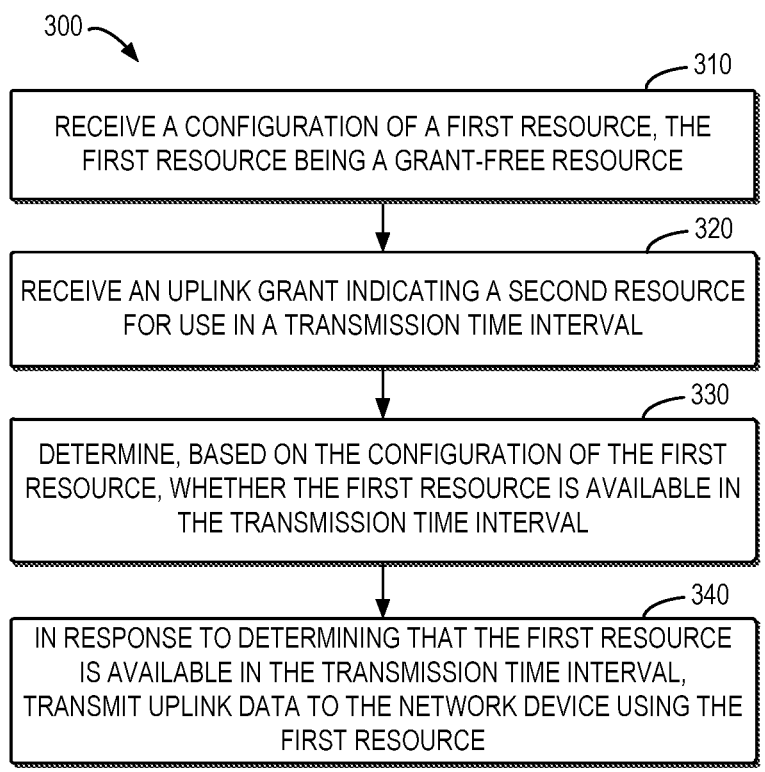
FIG. 3 shows a flowchart of an example method in accordance with some embodiments of the present disclosure.

FIG. 3 shows a flowchart of an example method 300 in accordance with some embodiments of the present disclosure. The method 300 can be implemented at the terminal device 120 as shown in FIG. 1 and is a detailed flowchart for the process 200 in FIG. 2A. For the purpose of discussion, the method 300 will be described from the perspective of the terminal device 120 with reference to FIG. 1.

At block 310, the terminal device 120 receives, from a network device 110, a configuration of a first resource, the first resource being a grant-free resource. At block 320, the terminal device 120 receives, from the network device 110, an uplink grant indicating a second resource for use in a transmission time interval. At block 330, the terminal device 120 determines, based on the configuration of the first resource, whether the first resource is available in the transmission time interval. At block 340, the terminal device 120 transmits, in response to determining that the first resource is available in the transmission time interval, uplink data to the network device 110 using the first resource.

In some embodiments, the first and second resources are allocated on a same carrier. In some embodiments, the first resource is allocated on a first carrier, and the second resource is allocated on a second carrier different from the first carrier.

In some embodiments, the method 300 further includes transmitting further uplink data to the network device using the second resource. A first power level for the transmitting of the uplink data may be greater than a second power level for the transmitting of the further uplink data.

In some embodiments, the configuration of the first resource includes a periodicity of the first resource.

It is to be understood that all operations and features related to the terminal device 120 described above with reference to FIG. 2A are likewise applicable to the method 300 and have similar effects. For the purpose of simplification, the details will be omitted.

Figure 4:
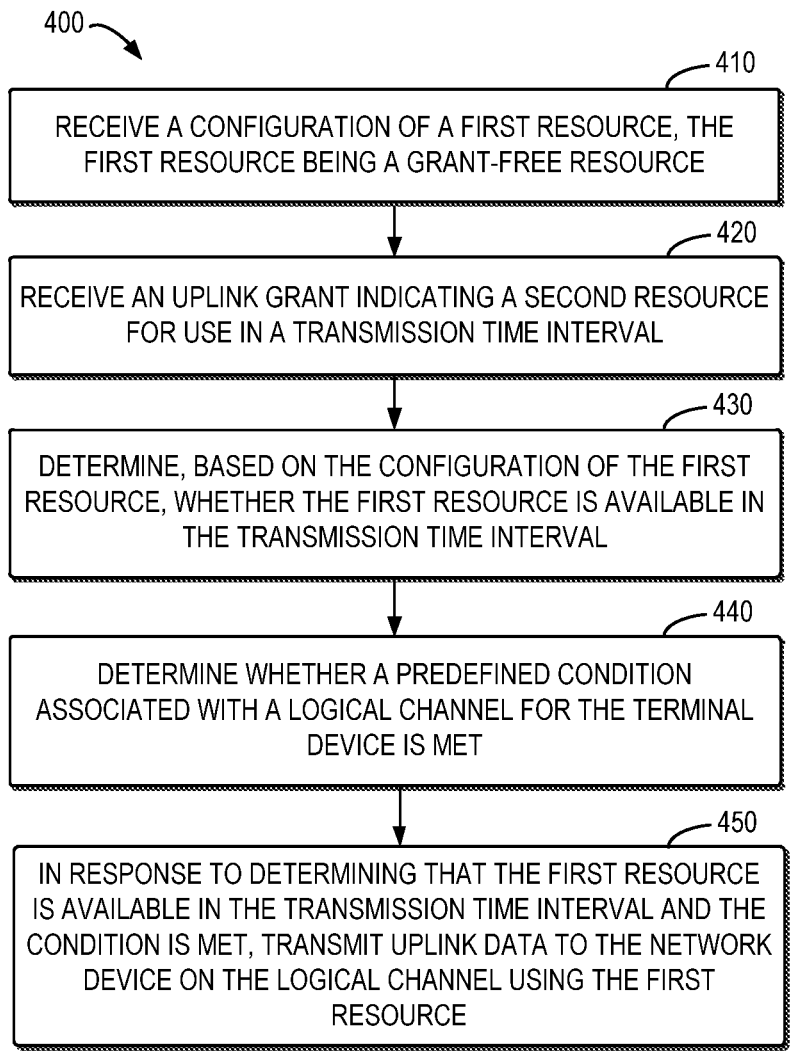
FIG. 4 shows a flowchart of an example method in accordance with some other embodiments of the present disclosure.

FIG. 4 shows a flowchart of an example method 400 in accordance with some embodiments of the present disclosure. The method 400 can be implemented at the terminal device 120 as shown in FIG. 1 and is a detailed flowchart for the process 202 in FIG. 2B. For the purpose of discussion, the method 400 will be described from the perspective of the terminal device 120 with reference to FIG. 1.

At block 410, the terminal device 120 receives, from a network device 110, a configuration of a first resource, the first resource being a grant-free resource. At block 420, the terminal device 120 receives, from the network device 110, an uplink grant indicating a second resource for use in a transmission time interval. At block 430, the terminal device 120 determines, based on the configuration of the first resource, whether the first resource is available in the transmission time interval. At block 440, the terminal device 120 determines whether a predefined condition associated with a logical channel for the terminal device is met. At block 450, the terminal device 120 transmits, in response to determining that the first resource is available in the transmission time interval and the condition is met, uplink data to the network device on the logical channel using the first resource.

In some embodiments, the terminal device 120 determines, in response to a first priority of the logical channel being greater than a threshold priority, that the condition is met.

In some embodiments, the terminal device 120 determines, in response to a first priority of the logical channel being greater than a second priority of a further logical channel for the terminal device, that the condition is met.

In some embodiments, the terminal device 120 determines, in response to a constraint indicating that the uplink data on the logical channel is allowed to be transmitted only using the first resource, that the condition is met.

In some embodiments, the first and second resources are allocated on a same carrier. In some embodiments, the first resource is allocated on a first carrier, and the second resource is allocated on a second carrier different from the first carrier.

In some embodiments, the method 400 further includes transmitting further uplink data to the network device on a further logical channel using the second resource. A first power level for the transmitting of the uplink data is greater than a second power level for the transmitting of the further uplink data.

In some embodiments, the configuration of the first resource includes a periodicity of the first resource.

It is to be understood that all operations and features related to the terminal device 120 described above with reference to FIG. 2B are likewise applicable to the method 400 and have similar effects. For the purpose of simplification, the details will be omitted.

Figure 5:
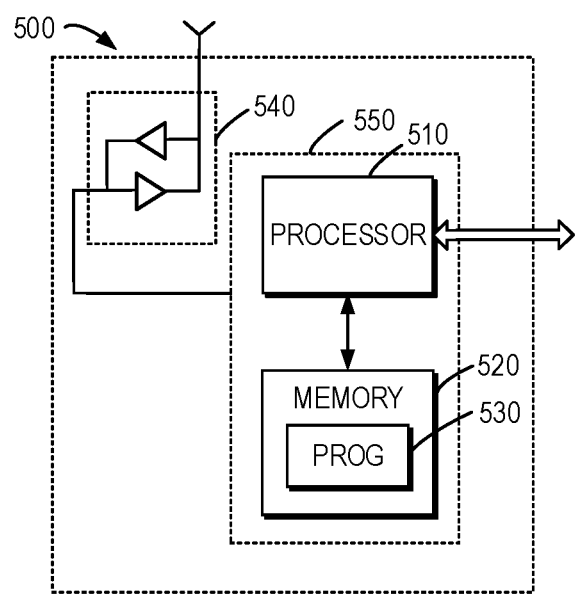
FIG. 5 is a simplified block diagram of a device that is suitable for implementing embodiments of the present disclosure.

FIG. 5 is a simplified block diagram of a device 500 that is suitable for implementing embodiments of the present disclosure. The device 500 can be considered as a further example embodiment of the terminal device 120 or the network device 110 as shown in FIGS. 1, 2A, and 2B. Accordingly, the device 500 can be implemented at or as at least a part of the terminal device 120 or the network device 110.

As shown, the device 500 includes a processor 510, a memory 520 coupled to the processor 510, a suitable transmitter (TX) and receiver (RX) 540 coupled to the processor 510, and a communication interface coupled to the TX/RX 540. The memory 520 stores at least a part of a program 530. The TX/RX 540 is for bidirectional communications. The TX/RX 540 has at least one antenna to facilitate communication, though in practice an Access Node mentioned in this application may have several ones. The communication interface may represent any interface that is necessary for communication with other network elements, such as X2 interface for bidirectional communications between eNBs, S1 interface for communication between a Mobility Management Entity (MME)/Serving Gateway (S-GW) and the eNB, Un interface for communication between the eNB and a relay node (RN), or Uu interface for communication between the eNB and a terminal device.

The program 530 is assumed to include program instructions that, when executed by the associated processor 510, enable the device 500 to operate in accordance with the embodiments of the present disclosure, as discussed herein with reference to FIGS. 2 to 4. The embodiments herein may be implemented by computer software executable by the processor 510 of the device 500, or by hardware, or by a combination of software and hardware. The processor 510 may be configured to implement various embodiments of the present disclosure. Furthermore, a combination of the processor 510 and memory 520 may form processing means 550 adapted to implement various embodiments of the present disclosure.

The memory 520 may be of any type suitable to the local technical network and may be implemented using any suitable data storage technology, such as a non-transitory computer readable storage medium, semiconductor based memory devices, magnetic memory devices and systems, optical memory devices and systems, fixed memory and removable memory, as non-limiting examples. While only one memory 520 is shown in the device 500, there may be several physically distinct memory modules in the device 500. The processor 510 may be of any type suitable to the local technical network, and may include one or more of general purpose computers, special purpose computers, microprocessors, digital signal processors (DSPs) and processors based on multicore processor architecture, as non-limiting examples. The device 500 may have multiple processors, such as an application specific integrated circuit chip that is slaved in time to a clock which synchronizes the main processor.

The components included in the apparatuses and/or devices of the present disclosure may be implemented in various manners, including software, hardware, firmware, or any combination thereof. In one embodiment, one or more units may be implemented using software and/or firmware, for example, machine-executable instructions stored on the storage medium. In addition to or instead of machine-executable instructions, parts or all of the units in the apparatuses and/or devices may be implemented, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), and the like.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

The present disclosure also provides at least one computer program product tangibly stored on a non-transitory computer readable storage medium. The computer program product includes computer-executable instructions, such as those included in program modules, being executed in a device on a target real or virtual processor, to carry out the process or method as described above with reference to any of FIGS. 2, 6, and 7. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific embodiment details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A method for use in a user equipment, the method comprising:
   receiving, from a network device, information for configuring a first resource without an associated dynamic grant;
   receiving, from the network device, a dynamic uplink grant via a physical downlink control channel, the dynamic uplink grant indicating a second resource for use in a transmission time interval;
   determining that the first resource overlaps the second resource;
   determining whether a first priority of a first logical channel that is associated with the first resource is greater than a second priority of a second logical channel that is associated with the second resource;
   based on the determining that the first resource overlaps the second resource and the determining that the first priority is greater than the second priority, transmitting uplink data to the network device on the first logical channel using the first resource; and
   based on the determining that the first resource overlaps the second resource and the determining that the first priority is not greater than the second priority, transmitting further uplink data to the network device on the second logical channel using the second resource.

2. The method of claim 1, wherein the first priority of the first logical channel corresponds to a priority of the uplink data of which is carried on the first logical channel, and the second priority of the second logical channel corresponds to a priority of further uplink data of which is carried on the second logical channel.

3. The method of claim 1, wherein the first priority and the second priority are received from the network device via logical channel configuration.

4. The method of claim 1, wherein the information for configuring the first resource is received via a radio resource control signaling.

5. The method of claim 1, wherein the information for configuring the first resource is received via a radio resource control signaling and a physical downlink control channel.

6. The method of claim 1, wherein the information for configuring the first resource includes a periodicity of the first resource.

7. The method of claim 1, wherein the first and second resources are allocated on a same carrier.

8. The method of claim 1, wherein the first resource is allocated on a first carrier, and the second resource is allocated on a second carrier different from the first carrier.

9. An apparatus, comprising:
at least one processor; and
at least one memory comprising computer program code, the at least one memory and the computer program code are configured, with the at least one processor, to cause the apparatus at least to:
receive, from a network device, information for configuring a first resource without an associated dynamic grant;
receive, from the network device, a dynamic uplink grant via a physical downlink control channel, the dynamic uplink grant indicating a second resource for use in a transmission time interval;
determine that the first resource overlaps the second resource;
determine whether a first priority of a first logical channel that is associated with the first resource is greater than a second priority of a second logical channel that is associated with the second resource;
based on the determining that the first resource overlaps the second resource and the determining that the first priority is greater than the second priority, transmitting uplink data to the network device on the first logical channel using the first resource; and
based on the determining that the first resource overlaps the second resource and the determining that the first priority is not greater than the second priority, transmitting further uplink data to the network device on the second logical channel using the second resource.

10. The apparatus of claim 9, wherein the first priority of the first logical channel corresponds to a priority of the uplink data of which is carried on the first logical channel, and the second priority of the second logical channel corresponds to a priority of further uplink data of which is carried on the second logical channel.

11. The apparatus of claim 9, wherein the first priority and the second priority are received from the network device via logical channel configuration.

12. The apparatus of claim 9, wherein the information for configuring the first resource is received via a radio resource control signaling.

13. The apparatus of claim 9, wherein the information for configuring the first resource is received via a radio resource control signaling and a physical downlink control channel.

14. The apparatus of claim 9, wherein the information for configuring the first resource includes a periodicity of the first resource.

15. The apparatus of claim 9, wherein the first and second resources are allocated on a same carrier.

16. The apparatus of claim 9, wherein the first resource is allocated on a first carrier, and the second resource is allocated on a second carrier different from the first carrier.

17. A non-transitory computer readable medium having instructions stored thereon, the instructions, when executed on at least one processor, causing the at least one processor to at least:
receive, from a network device, information for configuring a first resource without an associated dynamic grant;
receive, from the network device, a dynamic uplink grant via a physical downlink control channel, the dynamic uplink grant indicating a second resource for use in a transmission time interval;
determine that the first resource overlaps the second resource;
determine whether a first priority of a first logical channel that is associated with the first resource is greater than a second priority of a second logical channel that is associated with the second resource;
based on the determining that the first resource overlaps the second resource and the determining that the first priority is greater than the second priority, transmitting uplink data to the network device on the first logical channel using the first resource; and
based on the determining that the first resource overlaps the second resource and the determining that the first priority is not greater than the second priority, transmitting further uplink data to the network device on the second logical channel using the second resource.

18. The non-transitory computer readable medium of claim 17, wherein the first priority of the first logical channel corresponds to a priority of the uplink data of which is carried on the first logical channel, and the second priority of the second logical channel corresponds to a priority of further uplink data of which is carried on the second logical channel.

19. The non-transitory computer readable medium of claim 17, wherein the first and second resources are allocated on a same carrier.

20. The non-transitory computer readable medium of claim 17, wherein the first resource is allocated on a first carrier, and the second resource is allocated on a second carrier different from the first carrier.

\* \* \* \* \*